(12) United States Patent
Ries

(10) Patent No.: US 6,785,525 B2
(45) Date of Patent: Aug. 31, 2004

(54) MULTIBAND FREQUENCY GENERATION USING A SINGLE PLL-CIRCUIT

(75) Inventor: Christian Ries, Nürnberg (DE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 734 days.

(21) Appl. No.: 09/726,156

(22) Filed: Nov. 29, 2000

(65) Prior Publication Data

US 2001/0031627 A1 Oct. 18, 2001

(51) Int. Cl.[7] .............................. H04B 7/00; H04B 1/06; H04B 1/18
(52) U.S. Cl. ................. 455/258; 455/165.1; 455/168.1; 455/183.1; 455/188.1; 455/552.1; 331/2; 331/179
(58) Field of Search ........................... 455/165.1, 168.1, 455/183.1, 183.2, 188.1, 258–264, 315, 318, 550.1, 552.1; 331/1 R, 2, 25, 16, 17, 170, 179, 1 A

(56) References Cited

U.S. PATENT DOCUMENTS

| | | | |
|---|---|---|---|
| 4,510,461 A | * | 4/1985 | Dickes et al. ............... 331/1 A |
| 4,629,999 A | * | 12/1986 | Hatch et al. ................ 331/1 R |
| 4,912,432 A | * | 3/1990 | Galani et al. ................... 331/2 |
| 5,389,898 A | * | 2/1995 | Taketoshi et al. .............. 331/2 |
| 5,686,864 A | * | 11/1997 | Martin et al. ................ 331/1 A |
| 5,909,149 A | * | 6/1999 | Bath et al. ....................... 331/2 |
| 6,112,068 A | * | 8/2000 | Smith et al. ................. 455/260 |
| 6,208,875 B1 | * | 3/2001 | Damgaard et al. ........ 455/552.1 |
| 6,229,399 B1 | * | 5/2001 | Tobise et al. .................. 331/17 |

FOREIGN PATENT DOCUMENTS

| | | |
|---|---|---|
| DE | 26 07 530 C2 | 9/1977 |
| EP | 0 206 247 A2 | 12/1986 |
| FR | 2 685 583 | 6/1993 |
| GB | 2310 342 A | 8/1997 |
| JP | 09186587 A | 7/1997 |
| WO | WO 97/09786 | 3/1997 |
| WO | WO 98/17012 | 4/1998 |
| WO | WO 98/51014 | 11/1998 |

OTHER PUBLICATIONS

James A. Crawford, "Frequency Synthesizer design handbook," pp. 148–153, 1994, Norwood, MA.

* cited by examiner

*Primary Examiner*—Simon Nguyen
(74) *Attorney, Agent, or Firm*—Jenkens & Gilchrist, P.C.

(57) ABSTRACT

To minimize the overall circuitry necessary in a multiband-frequency generator, output terminals of a voltage-controlled multiband oscillator (22-1, . . . , 22-N) are coupled to a frequency synthesis unit (10) via a frequency selective coupling unit (24). The frequency synthesis unit (10) derives a phase difference between a frequency control input signal and the output signal of the frequency selective coupling unit (24) to control the voltage-controlled multiband oscillator (22-1, . . . , 22-N).

18 Claims, 9 Drawing Sheets

MULTIBAND FREQUENCY GENERATION USING A SINGLE PLL-CIRCUIT

The present invention relates to a multiband frequency generation with a PLL-circuit. In particular, the present invention relates to a multiband frequency generator to generate an output signal in a plurality of frequency bands and, further to a sending/receiving unit wherein the multiband frequency generator according to the present invention may be used.

FIG. 8 shows a typical method for sending and receiving signals in mobile phones. In the receiving path, a first mixer stage 204 comprising a multiplier 200 and a band pass filter 202 is supplied with a local oscillator signal outputted through a frequency generator 206 such that at the output of the mixer stage 204 the receiving signal is available according to a fixed intermediate frequency (IF) for the further processing in downstream circuit unit (not shown).

As also shown in FIG. 8, when sending a modulated sending signal (provided in the base-band) this sending signal is converted to an intermediate frequency-band specified through a sending intermediate frequency signal using a second mixer stage 208 with a second multiplier 210 and a second band-pass 212. Then, the conversion to the sending channel is executed through a third mixer stage 218 comprising a third multiplier 214 and a third band-pass filter 216.

FIG. 9 shows a detailed schematic diagram for the frequency generation unit 206. Here, the object is to tune the frequency of a voltage-controlled oscillator 220 such that it is coincident to a frequency of a basic oscillator 222 multiplied with a dividing factor of a second programmer divider 228. In FIG. 9, specific numerical values are given for a GSM-application example in square brackets.

The basic oscillator 222 comprises a reference oscillator 224 and in addition a first programmable divider 226 to variably pre-specify a reference frequency. A second programmable divider 228 is provided to convert the frequency generated by the voltage-controlled oscillator 222 into the pre-specified reference frequency outputted by the basic oscillator 222.

A phase detector 230 enables a comparison of the sending signal converted with the second programmable divider 228 and the reference signal outputted through the first programmable divider 226. The phase error between the divided reference signal and the divided output signal of the voltage-controlled oscillator 220 determined by the phase detector 230 is supplied to a loop filter 232 where an integration takes place.

Using this integrated error signal, the voltage-controlled oscillator 220 is controlled until there exists no further frequency and phase difference, respectively, between the signals used for comparison. Herethrough, the voltage-controlled oscillator 220 has a relative stability that is identical to the relative stability of the basic oscillator 222. For the example shown in FIG. 9, e.g., in case the relative stability of the basic oscillator is (1 Hz)/(200 kHz) the relative stability for the voltage-controlled oscillator 220 is (3860 Hz)/(772 Mhz).

For applications such as GSM 900, GSM 1800 or PCS-mobile telephony, the tuning of the receiving or sending channel is carried out through determination of the divider ratio for the first and second programmable divider 226 and 228, respectively. Therefore, the voltage-controlled oscillator 220 may easily be tuned to different sending frequencies within a stable operation. Here, the adjustment behaviour and the stability is essentially determined through the design of the loop filter 232.

The design shown in FIG. 9 is suitable for mobile phones being operated in one frequency band. However, this single-band operation is no longer suitable in view of the increasing number of subscribers and the limited number of sending frequencies in existing cellular mobile networks.

To the contrary, a combination of technical advantages being related to different approaches seems to be promising, in particular through providing multiband cellular networks and multiband mobile phones being related thereto, e.g., through combining the GSM 900, GSM 1800 and PCS frequency bands.

However, a prerequisite to this approach is the frequency generation for the respective frequency bands while simultaneously meeting the strict requirements explained with respect to FIGS. 8 and 9. For a dual band operation two frequency generators will be required for the two frequency bands. However, it is not possible to use only a single voltage-controlled oscillator since the tuning range that will be necessary in case of a single voltage-controlled oscillator would lead to an influence of noise onto the system that is too large and therefore to a violation of pre-defined specifications. Therefore, two voltage-controlled oscillators operating independently should be provided for the dual band operation mode.

The direct generalization of the approach explained with reference to FIG. 9 would be a duplication of the components according to the number of pre-specified frequency bands. While this allows to provide frequency signals in an independent manner through related phase-locked loop circuits, this may only be achieved with significant additional circuitry and additional costs. Further, increased space requirements constitute a barrier against this approach, since a plurality of frequency synthesis units are necessary, e.g., in the form of a plurality of integrated circuits.

In view of the above, the object of the present invention is to provide a multiband frequency generator with minimized circuitry requirements.

According to the present invention, this object is achieved through a multiband frequency generator to generate an output signal in at least two frequency bands, comprising a voltage-controlled multiband oscillator to generate an output signal in each frequency band at one output for each frequency band, a frequency synthesis means to derive a phase difference between a control input signal for the frequency and the generated output signal, at least one control means for the voltage-controlled multiband oscillator using the phase difference generated through said frequency synthesis means as correcting or manipulating variable, respectively, wherein each output terminal of said multiband oscillator is coupled to the frequency synthesis means via a frequency selective coupling means.

Therefore, according to the present invention, only a single frequency synthesis means must be used since different output branches of the multiband frequency generator are always coupled to the same frequency synthesis means in a frequency selective way. The frequency selective behaviour of the coupling unit enables an excellent decoupling of the different single oscillator units of the voltage-controlled multiband oscillator.

Further, the invention enables a low loss between the different oscillator units of the voltage-controlled multiband oscillator and the phase-locked loop circuit comprising the frequency synthesis means and the control means.

Still further, the frequency selective coupling means also enables an impedance matching between the oscillator units of the voltage-controlled multiband oscillator and the phase-locked loop circuit and in addition a DC-decoupling.

According to a further preferred embodiment of the present invention, a control means is provided for each frequency band.

The provision of a single control means for each frequency band enables the individual determination of the adjustment behaviour and the stability of the different voltage-controlled oscillators.

According to a further preferred embodiment of the present invention, the voltage-controlled multiband oscillator comprises a plurality of voltage-controlled single band oscillators connected in parallel. Alternatively, there may be provided a switchable voltage-controlled oscillator. Both approaches enable the flexible handling of pre-defined specifications in that the number of voltage-controlled single band oscillators and switching stages of the switchable voltage-controlled oscillator, respectively, is adjusted to the number of frequency bands that must be generated.

According to a further preferred embodiment, the frequency selective coupling means comprises a filter bank.

Hereby the decoupling and impedance matching may be optimized in a scalable manner in dependence of the number of pre-specified frequency bands and also in dependence of the specifications to be fulfilled.

Overall, the present invention enables the multiband-frequency generation with only a single PLL-circuit while using only a single frequency synthesis means through switching the supply voltage between the oscillator units of the voltage-controlled multiband oscillator and also through frequency selective coupling of the output signal at the phase-locked loop circuit.

Preferred embodiments of the present invention will be described in the following under reference to the enclosed drawings in which.

Figure 1:
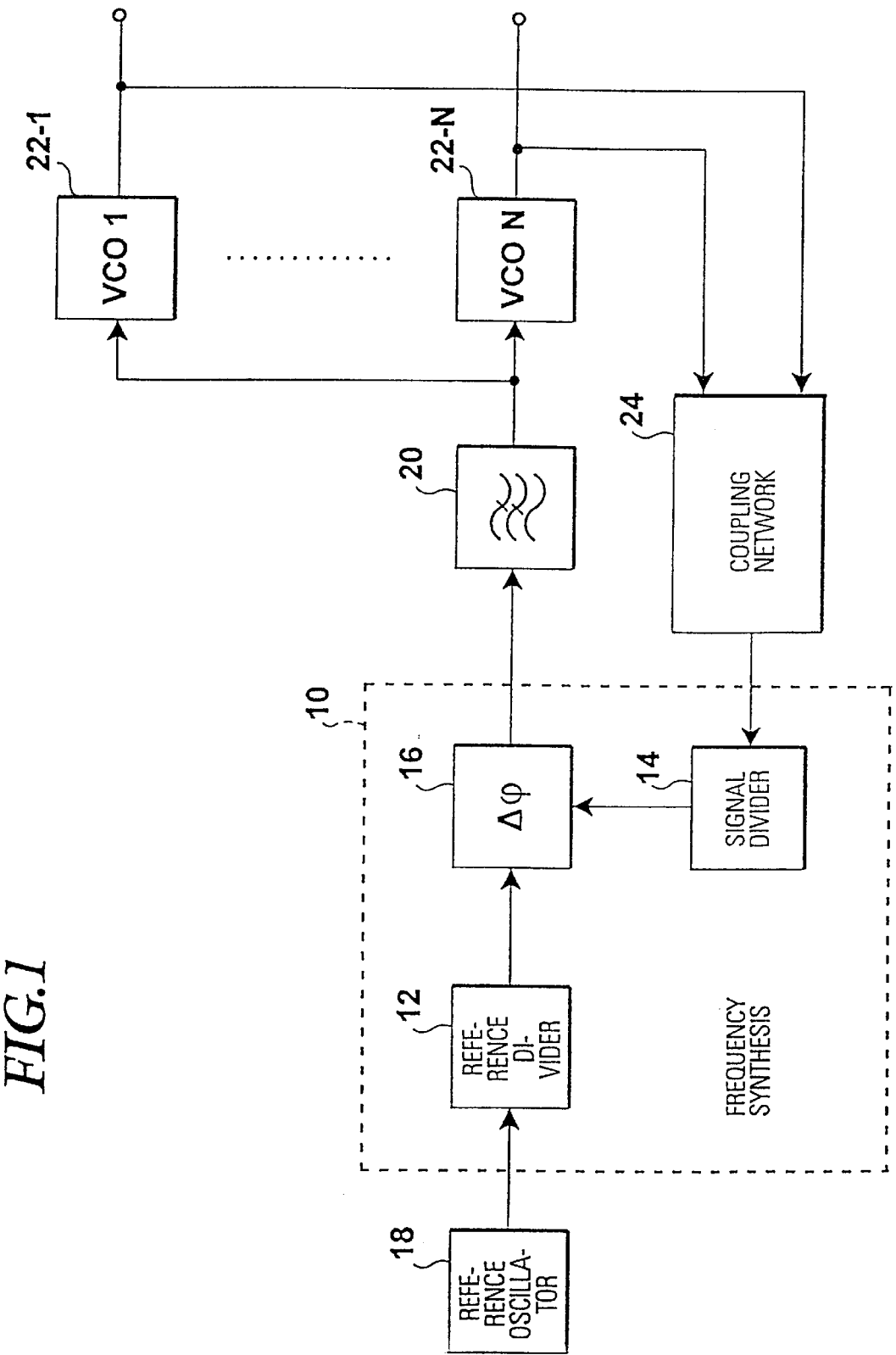
FIG. 1 shows a schematic diagram of a first embodiment of the multiband frequency generator according to the present invention.

As shown in FIG. 1, the multiband frequency generator according to the present invention comprises only one frequency synthesis unit 10. The frequency synthesis unit 10 comprises a programmable reference divider 10, a programmable signal divider 14 and a phase detector 16. The input to the programmable reference divider 12 is connected to a reference oscillator 18. Further, the output terminal of the programmable reference divider 12 and the output terminal of the programmable signal divider 14 are connected to the input terminals of the phase detector 16, respectively.

As also shown in FIG. 1, according to the first embodiment of the present invention the output terminal of the phase detector 16 is connected to the input terminal of a loop filter 20 provided for all frequency bands in common such that the output signal of the loop filter 20 is supplied to the different voltage-controlled oscillators 22-1 to 22-N as correcting variable or equivalently as controller output. The output terminals of the voltage-controlled oscillator 22-1, . . . , 22-N are connected to the input terminal of the programmable signal divider 14 in the frequency synthesis unit 10 via a coupling network 24.

During operation of the multiband frequency generator according to the present invention the frequency band is determined on the one hand through the selection of the power supply for the voltage-controlled oscillators 22-1, . . . , 22-N and on the other hand through the programming of the programmable reference divider 12. Therefore, at every time one of the voltage-controlled oscillators 22-1, . . . , 22-N outputs an output signal at a frequency which is controlled according to the frequency control input signal provided through the reference oscillator 18 and the programmable reference divider 12.

Heretofore, the output signal of the coupling network 24 is forwarded to the second programmable signal divider 14 adapted through appropriate programming to re-convert the output signal of the activated voltage-controlled oscillator 22-1, . . . , 22-N into the range of the frequency control input signal. Then, the phase detector 16 derives the phase difference between the frequency control input signal at the output of the programmable reference divider 12 and the output signal of the programmable signal divider 14.

This phase difference is then supplied to a loop filter 20 with integrating characteristics. The output signal of this loop filter 20 is used to control the activated voltage-controlled oscillator 22-1, . . . , 22-N such that the phase difference at the output of the phase detector 10 is at least constant, i.e. the frequency of the output signal of the activated voltage-controlled oscillator 22-1, . . . , 22-N after division through the programmable signal divider 14 is coincident to the frequency of the frequency control input signal.

Figure 2:
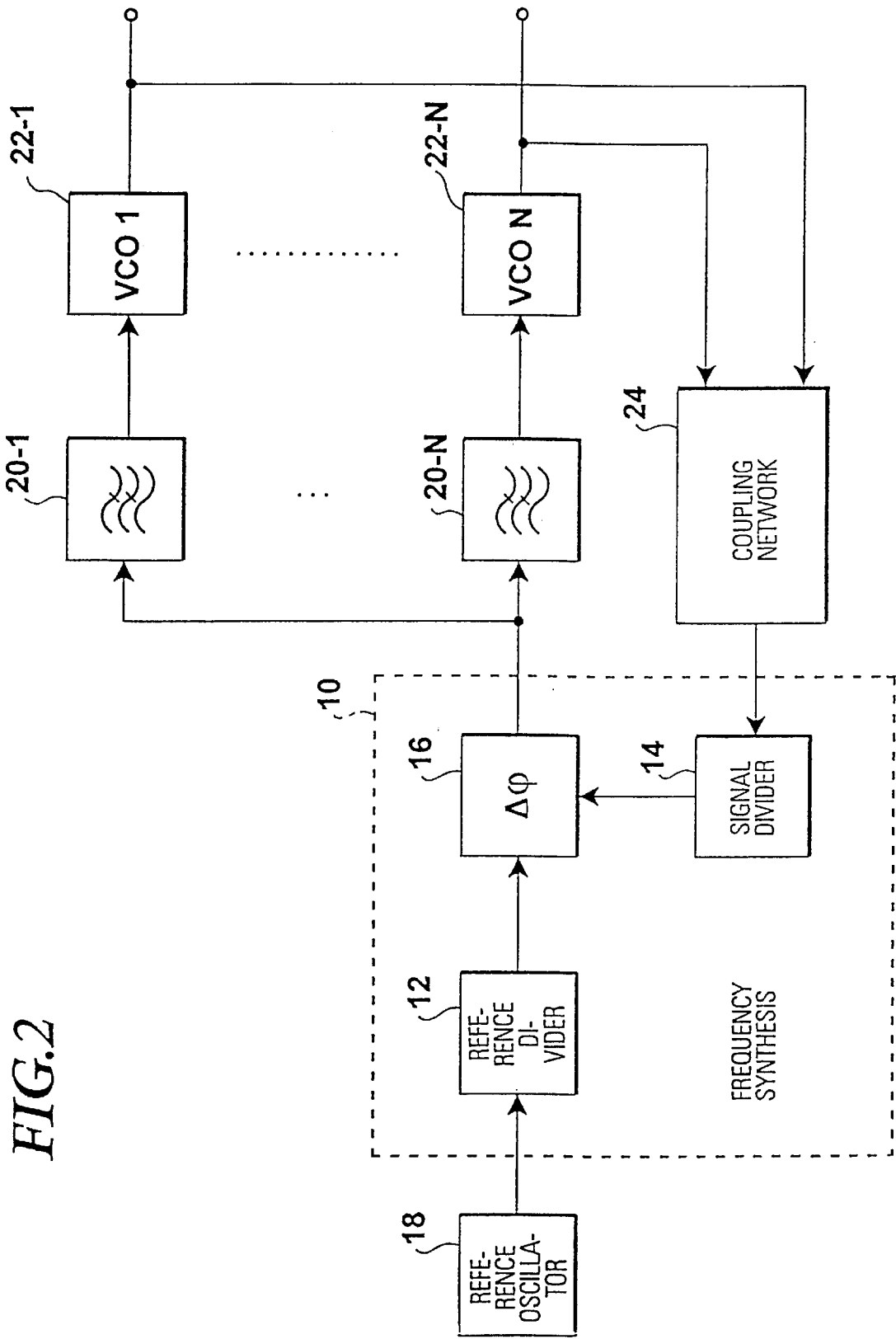
FIG. 2 shows a schematic diagram of a second embodiment of the multiband frequency generator according to the present invention.

FIG. 2 shows a schematic diagram of a second embodiment of the multiband frequency generator. In FIG. 2, circuit components having a functionality being identical to that of components shown in FIG. 1 are denoted using the same reference numerals.

As shown in FIG. 2, according to the second embodiment of the present invention for each voltage-controlled oscillator 22-1, . . . , 22-N there is provided a dedicated loop filter 20-1, . . . , 20-N.

To process the phase difference in a frequency selective way this phase difference is supplied to a loop filter 20-1, 20-N specifically provided for each frequency band. The output signal of each loop filter 20-1, . . . , 20-N is then used to control the related voltage-controlled oscillator 22-1, . . . , 22-N such that the frequency resulting from a division of the output signal frequency of the related voltage-controlled oscillator 22-1, . . . , 22-N is coincident to the frequency control input signal.

Therefore, the second embodiment of the present invention enables a specific tuning of the transient behaviour and the stability of each voltage-controlled oscillator.

Figure 3:
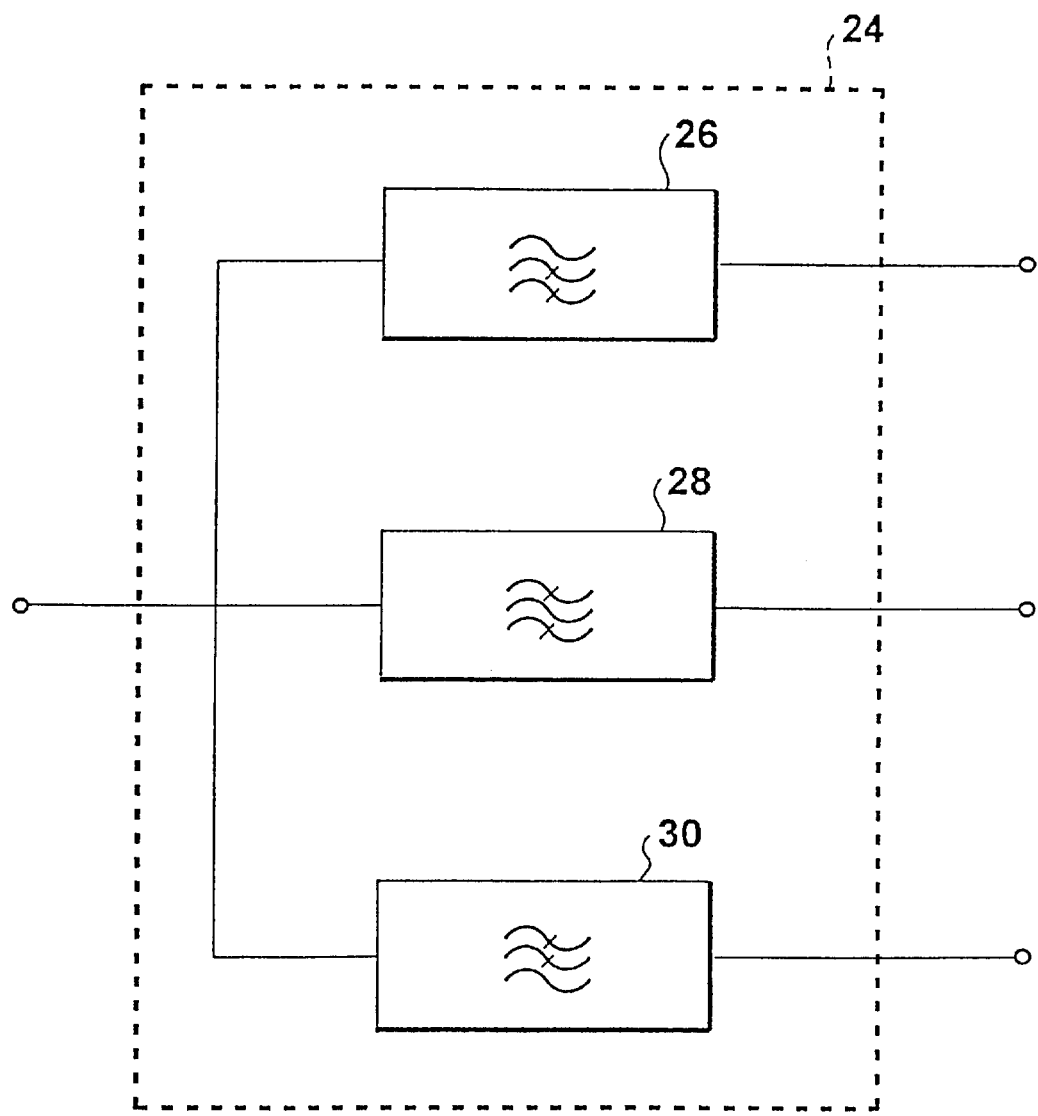
FIG. 3 shows a schematic diagram of the frequency selective coupling unit according to the present invention.

FIG. 3 shows a schematic diagram of the coupling network 24 shown in FIG. 1. This coupling network 24 is implemented as filter bank and comprises at least two elements taken from a group consisting of a high pass filter 26, a band pass filter 28 and a low pass filter 30.

Operatively, the coupling network 24 and the filter component comprised therein achieves an effective decoupling between the different voltage-controlled oscillator units 22-1, . . . , 22-N of the voltage-controlled multiband oscillator, both, for the first and second embodiment of the present invention. Further, operatively the coupling network 24 enables an impedance matching between different voltage-controlled oscillators 22-1, . . . , 22-N and the input impedance of the programmable signal divider 14. Further, through appropriate design the loss between each voltage-controlled oscillator 22-1, . . . , 22-N and the phase-locked loop circuit consisting of the frequency synthesis unit 10 and the loop filter 20 is minimized.

Figure 4:
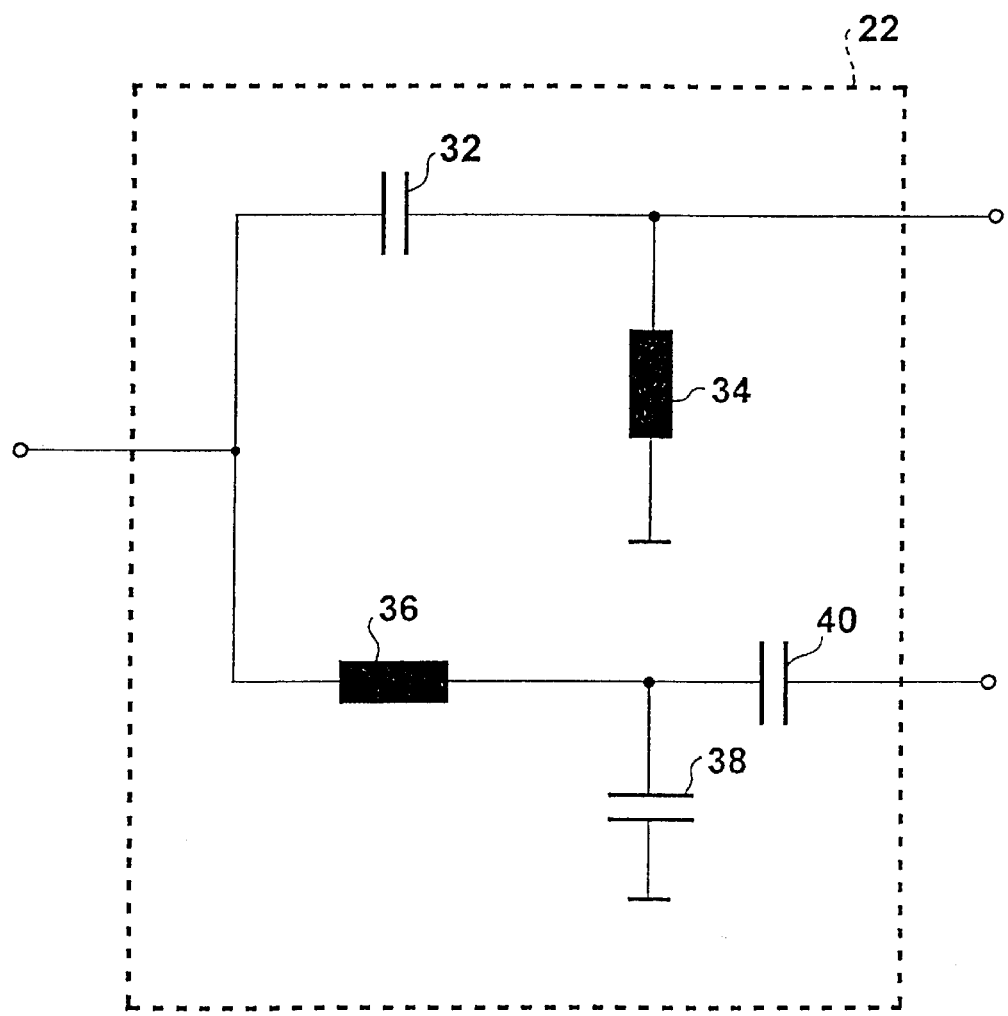
FIG. 4 shows a circuit diagram of the frequency selective coupling unit shown in FIG. 2.

FIG. 4 shows a specific implementation of the coupling network 24 for a dual band operation. This coupling network 24 comprises a high pass filter and a low pass filter.

As shown in FIG. 4, the high pass filter consists of a first capacitor 32 connected in series and a first inductivity 34 connected thereto in parallel. The low pass filter consists of an inductivity 36 connected in series and a second capacitor 38 connected in parallel. At a branch point between the second inductivity 36 and the second capacitor 38 there is connected a third capacitor 40 in series. The cutoff frequency of the high pass filter with the first capacitor 32 and the first inductivity 34 lies above the signal frequency of the voltage-controlled oscillator in the lower frequency band.

Operatively, the first capacitor 32 shortcuts signals in the higher frequency range while signal components of lower frequency are branched off through the first inductivity 34. Further, the first capacitor 32 and the first inductivity 34 enable an impedance matching between the related voltage-controlled oscillator and the input terminal of the programmable signal divider 14.

Further, the second inductivity 36 shown in FIG. 4 forwards signal components with lower frequencies to the programmable signal divider 14 while signal components in the higher frequency ranges are shortcut through the second capacitor 38 to ground. The third capacitor 40 is provided for a DC-decoupling. Further, the second inductivity 36 and the second capacitor 38 also enable an impedance matching between the related voltage-controlled oscillator and the input terminal of the programmable signal divider 14.

Figure 5:
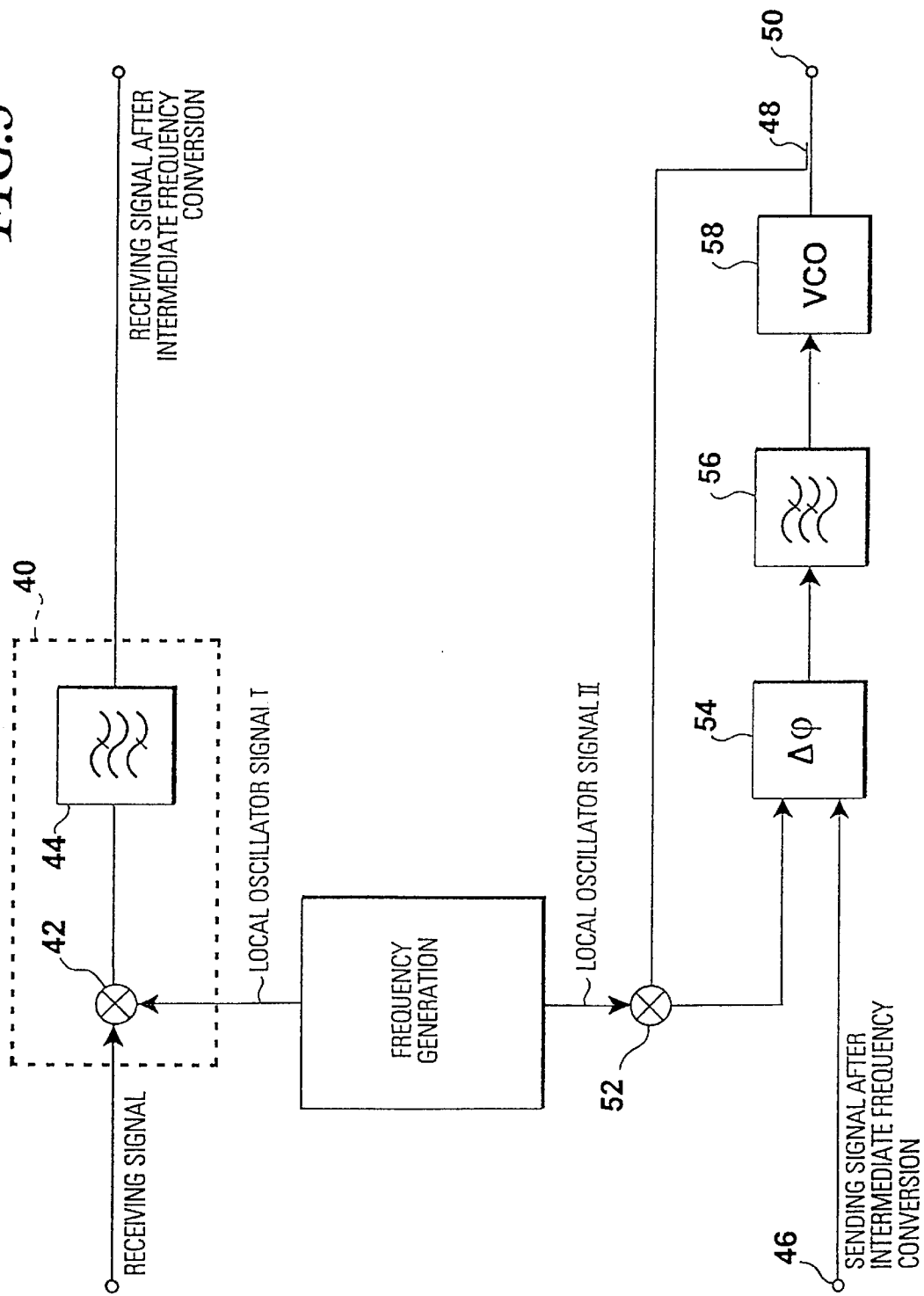
FIG. 5 shows the principles for a sending/receiving operation mode using the multiband-frequency generator according to the present invention.

FIG. 5 shows the basic principle underlying the application of the multiband frequency generator according to the present invention.

Figure 8:
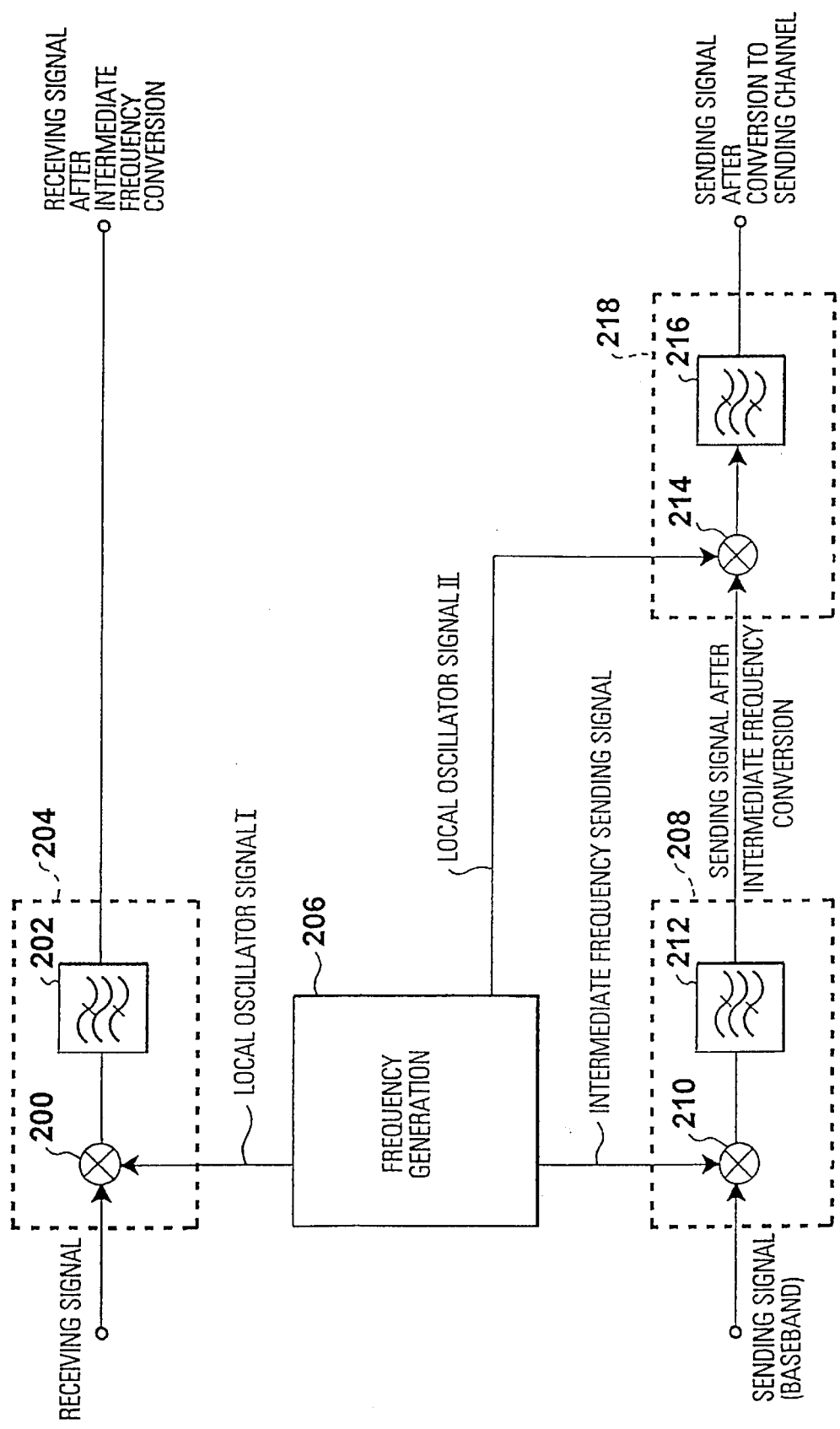
FIG. 8 shows a schematic diagram according to the intermediate frequency conversion for sending and receiving signals.
Figure 9:
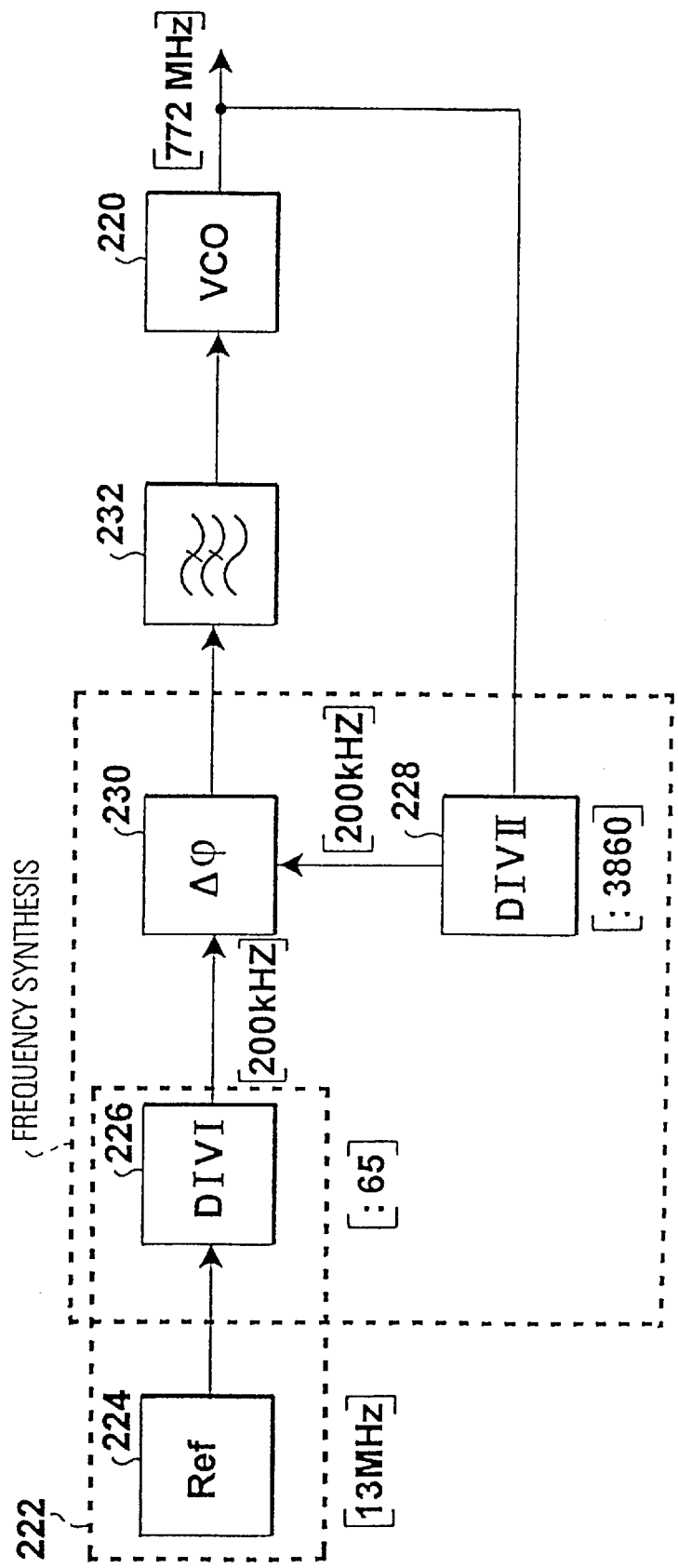
FIG. 9 shows the mode of operation for a follow-up synchronization with a single PLL-circuit.

As shown in FIG. 5, a local oscillator signal is generated in a frequency generator and this local oscillator signal is used in a mixer stage 40 comprising a multiplier 42 and a band pass 44 for the conversion of the receiving signal in a receiving intermediate frequency range. In this respect the approach is similar to the approach explained with reference to FIG. 8 that is also related to the intermediate frequency conversion of a receiving signal.

However, as is shown in FIG. 5, the conversion in the sending channel is implemented in a completely different way. At a sending terminal 46 an intermediate frequency modulated sending signal is supplied. At the same time a sending signal outputted via a sending output terminal 50 is supplied to a re-convert multiplier 52 via a tap 48. Here, the re-convert multiplier 52 serves to re-convert the sending signal into the intermediate frequency band. A sending phase detector determines the phase difference between the IF-re-converted sending signal and the IF-modulated sending signal and at the same time implements a filtering of those signal components comprised in the IF-re-converted sending signal which are to be suppressed for the further processing.

Using the phase difference available at the output terminal of the sending phase detector 54, a voltage-controlled sending oscillator 58 is controlled via a loop filter 56 such that the phase difference between the IF-re-converted sending signal and the IF-modulated sending signal is used as a correcting variable, or in other words, the IF-modulated sending signal is impressed onto the output signal of the voltage-controlled sending oscillator 58.

Figure 6:
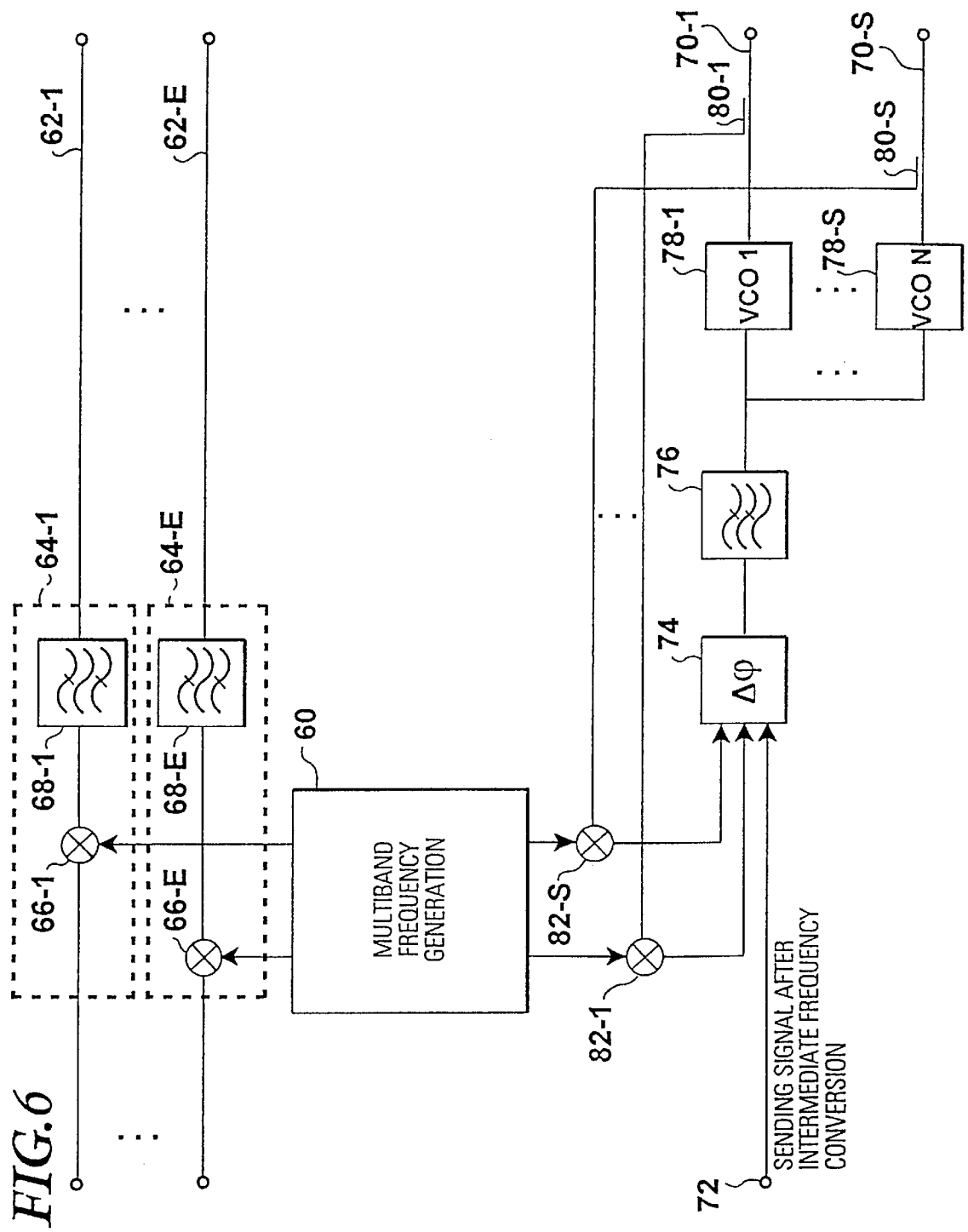
FIG. 6 shows a schematic diagram for the sending/receiving operation using the multiband frequency generator according to the present invention, wherein the sending and receiving is executed in a plurality of frequency bands while using a common loop filter for all sending branches.

FIG. 6 shows a first application of the multiband-frequency generator according to the present invention in a sending/receiving unit being operated in accordance to the functional diagram explained above with respect to FIG. 5.

As shown in FIG. 6, a multiband-frequency generator 60 according to the first and second embodiment, respectively, is connected to a plurality of receiving channels 62-1, . . . , 62-E. In each receiving channel 62-1, . . . , 62-E there is provided a related mixing stage 64-1, . . . , 64-E each comprising a multiplier 66-1, . . . , 66-E and a band-pass filter 68-1, . . . , 68-E, respectively. Operatively, to each receiving channel there is supplied a suitable local oscillator signal through the multiband frequency generator 58 in accordance with the respective frequency band.

As also shown in FIG. 6, there is also provided a plurality of sending channels 70-1, . . . , 70-S. A sending terminal 72 is provided to supply an IF-modulated sending signal which is directed towards one input terminal of a multiband sending phase detector 74 processing the IF-modulated sending signal and an IF-re-converted sending signal at every time. The output signal of this multiband sending phase detector 74 is supplied via a multiband loop filter to each of a plurality of voltage-controlled oscillators 78-1, . . . , 78-S provided for the different sending frequency bands. At the output terminal of each such voltage-controlled oscillator 78-1, . . . , 78-S, the related output signal is picked up with a tap 80-1, . . . , 80-S to the related IF-re-conversion-multiplier 82-1, . . . , 82-S provided for a re-conversion of the sending signal into the IF-frequency-band, respectively.

Figure 7:
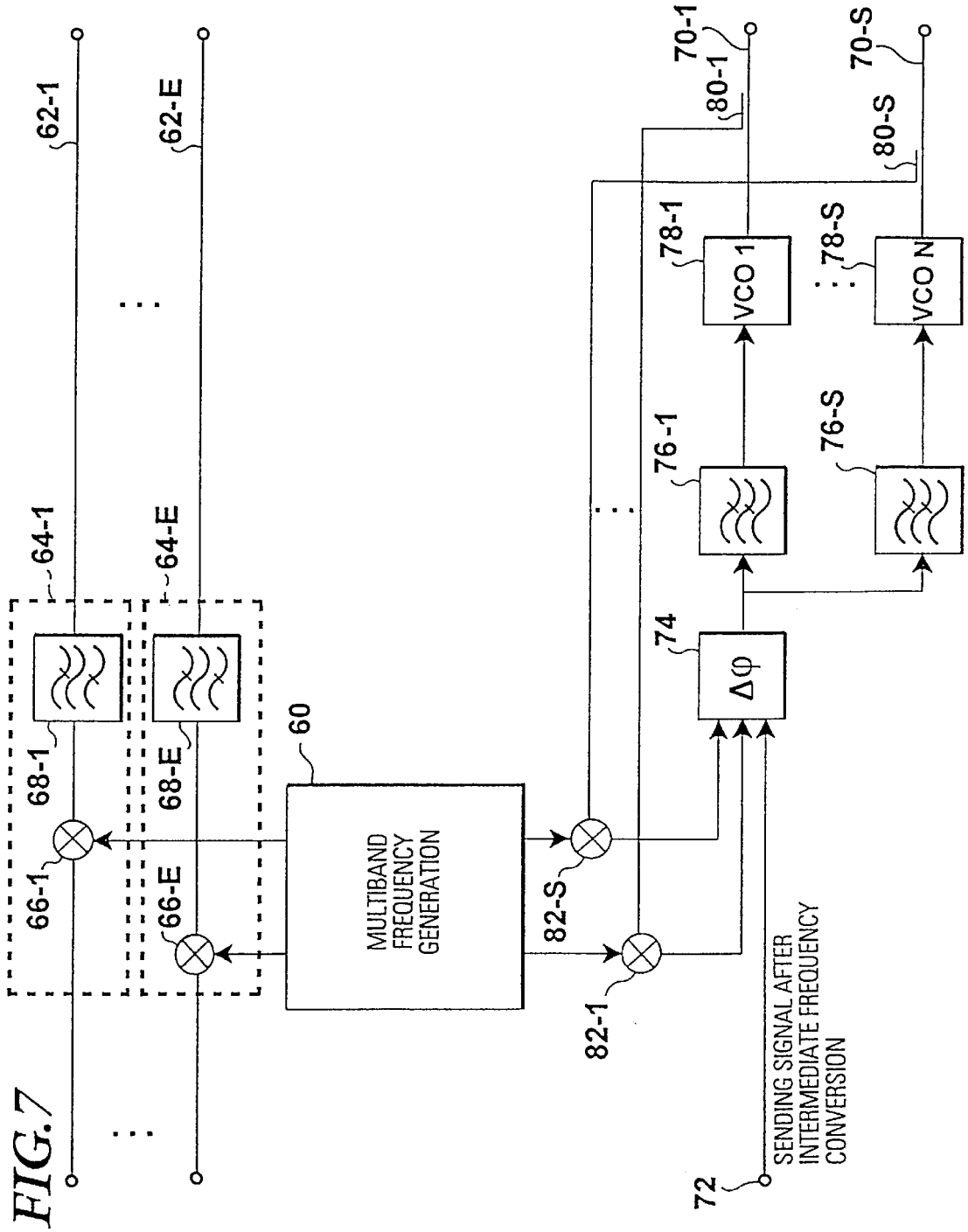
FIG. 7 shows a schematic diagram for the sending/receiving operation using the multiband frequency generator according to the present invention, wherein the sending and receiving is executed in a plurality of frequency bands while using a loop filter for every sending branch.

FIG. 7 shows a second application of the multiband frequency generator according to the present invention within a sending/receiving unit in accordance with the basic functional principle outlined above with reference to FIG. 5. Here, circuit components having the same functionality as those shown in FIG. 6 are denoted with the same reference numerals.

The second application of the multiband frequency generator according to the present invention differs from the first application explained above with reference to FIG. 6 in that there is provided a single loop filter 76-1, . . . , 76-S in each sending branch 70-1, . . . , 70-S to control the related voltage-controlled oscillator 78-1, . . . , 78-S. Therefore, the transient behaviour and the related stability in each sending channel 70-1, . . . , 70-S may be controlled and varied selectively.

Since the mode of operation for every single sending branch is identical to the mode of operation explained above with reference to FIG. 5, both for the first and second generation mode of the multiband-frequency generator it will not be explained here. Contrary to the single band operation the stable and precise provision of the different local oscillator signals for the receiving channels 62-1, . . . , 62-E and the sending channels 72-1, . . . , 72-S, respectively, is a prerequisite for a stable and reliable sending reception in the multiband operation. Further, the impression of a phase difference between an IF-re-converted sending signal and the related IF-reference signal onto the related voltage-controlled sending oscillator leads to a very efficient and circuitry minimizing realization of the sending operation in the multiband mode as—contrary to the approach explained with reference to FIG. 8—it is not necessary to provide a single band pass filter for each sending channel 72-1, . . . , 72-S.

What is claimed is:

1. A multiband frequency generator adapted to generate an output signal in at least two frequency bands, comprising:
   a voltage-controlled multiband oscillator adapted to generate an output signal in each frequency band at one output terminal for each frequency band,
   a frequency sythesis unit adapted to derive a phase difference between a control input signal for a frequency and said generated output signal,
   at least one control unit for said voltage-controlled multiband oscillator using said phase difference generated through said frequency synthesis unit as correction variable, respectively, wherein
       each output terminal of said multiband oscillator is coupled to said frequency synthesis unit via a frequency selective filterbank adapted to achieve a decoupling of said different multiband oscillator output signals through a frequency selective behaviour of filters before feedback to said frequency synthesis unit, and
       the filterbank comprises at least one filter selected from a group consisting of a low pass filter, a bandpass filter, and a high pass filter.

2. The multiband frequency generator of claim 1, wherein said control unit for said voltage-controlled multiband oscillator is a loop filter.

3. The multiband frequency generator of claim 1, wherein a dedicated control unit is provided for each frequency band.

4. The multiband frequency generator of claim 3, wherein each control unit for said voltage-controlled multiband frequency oscillator is a loop filter.

5. The multiband frequency generator of claim 1, wherein said voltage-controlled multiband oscillator comprises a plurality of voltage-controlled single band oscillators connected in parallel.

6. The multiband frequency generator of claim 1, wherein said voltage-controlled multiband oscillator is a switchable voltage-controlled oscillator.

7. The multiband frequency generator of claim 1, comprising:
   wherein
       said frequency selective coupling unit is passive, and
       said frequency synthesis unit comprises:
           a first programmable reference divider adapted to derive said control input signal by dividing a frequency of a pre-specified reference signal,
           a second programmable signal divider adapted to divide said frequency of said output signal of said frequency selective coupling unit by a predefined factor, and
           a phase difference detector unit adapted to derive said phase difference between said output signal of said first programmable reference divider and said output signal of said second programmable signal divider.

8. The multiband frequency generator of claim 1, wherein said low pass filter comprises a first inductivity connected in series between an input terminal of said low pass filter and an output terminal of said low pass filter and wherein a first capacitor branches off to ground before said first inductivity.

9. The multiband frequency generator of claim 8, wherein in said low pass filter a second capacitor is connected in series between said first inductivity and said input terminal of said low pass filter.

10. The multiband frequency generator of claim 1, wherein said high pass filter comprises a third capacitor connected in series between an input terminal of said high pass filter and an output terminal of said high pass filter and a second inductivity branches off to ground before said third capacitor.

11. A sending/receiving unit for a mobile radio unit with multiband operation, comprising:
   at least one receiving branch for each receiving frequency band with a mixer stage, whereto a first local oscillator signal is supplied in a suitable manner,
   at least one transmitting branch for each transmitting frequency band in which an intermediate frequency modulated sending signal is converted into a sending frequency band, wherein
       the conversion into said sending frequency band is achieved through a phase comparison of an intermediate frequency modulated sending signal with a sending signal re-converted into an intermediate frequency band and through control of a voltage-controlled oscillator in accordance with a phase difference, and
   a multiband frequency generator adapted to generate the local oscillator signals, the multiband frequency generator comprising:
       a voltage-controlled multiband oscillator adapted to generate a local oscillator signal at one output terminal for each local oscillator signal,
       a frequency synthesis unit adapted to derive a phase difference between a control input signal for a frequency and said generated local oscillator signal,
       at least one control unit for said voltage-controlled multiband oscillator using said phase difference generated through said frequency synthesis unit as correcting variable,
       wherein each output terminal of said multiband oscillator is coupled to said frequency synthesis unit via a frequency selective filterbank adapted to achieve a decoupling of said different multiband oscillator output signals through a frequency selective behaviour of filters before feedback to said frequency synthesis unit, and
       wherein the filterbank comprises at least one filter selected from a group consisting of a low pass filter, a bandpass filter, and a high pass filter.

12. The sending/receiving unit of claim 11, wherein said transmitting branch for each transmitting frequency band comprises:
   a phase detector adapted to generate said frequency difference between said intermediate frequency modulated sending signal and said sending signal reconverted into said intermediate frequency at an output of the transmitting branch, and
   a loop filter adapted to supply said phase difference generated through said phase comparison to said voltage-controlled oscillator of said transmitting branch.

13. The sending/receiving unit of claim 12, wherein said phase detector and said loop filter for each transmitting branch are common to each transmitting branch.

14. The sending/receiving unit of claim 12, wherein a loop filter is provided for each transmitting branch.

15. The sending/receiving unit of claim 11, wherein a multiplication unit is provided in each transmitting branch to re-convert said output signal of different sending channels through multiplication with a related second local oscillator signal.

16. A method of operating a multiband frequency generator to generate an output signal in at least two frequency bands, comprising the steps of:

outputting the output signal via one output of a voltage-controlled multiband oscillator for each frequency band, deriving a phase difference between a frequency control input signal and the generated output signal in a frequency synthesis unit, controlling the voltage-controlled multiband oscillator using said phase difference as correcting variable, coupling the output signal at said output terminal of said voltage-controlled multiband oscillator via a frequency selective filterbank adapted to achieve a decoupling of the different multiband output signals through a frequency selective behaviour of filters before feedback to said frequency synthesis unit, and wherein the filterbank comprises at least one filter selected from a group consisting of a low pass filter, a bandpass filter, and a high pass filter.

17. The method of claim 16, wherein a selection of the frequency band is achieved through switching on and off, respectively, a related unit in the voltage-controlled multiband oscillator and further through suitable definition of said frequency control input signal.

18. The method of claim 16, wherein a filtering of the output signal is executed in a filter bank for said frequency selective coupling of the output signal of said voltage-controlled multiband oscillator.

* * * * *

UNITED STATES PATENT AND TRADEMARK OFFICE
CERTIFICATE OF CORRECTION

PATENT NO. : 6,785,525 B2
DATED : August 31, 2004
INVENTOR(S) : Christian Ries

It is certified that error appears in the above-identified patent and that said Letters Patent is hereby corrected as shown below:

Column 7,
Lines 44-48, replace "The multiband frequency generator of claim 1, comprising: wherein said frequency selective coupling unit is passive, and said frequency synthesis unit comprises:" with -- The multiband frequency generator of claim 1, wherein said frequency synthesis unit comprises: --.

Signed and Sealed this

Twenty-fifth Day of October, 2005

JON W. DUDAS
*Director of the United States Patent and Trademark Office*